US005783339A

United States Patent [19]

Watanabe et al.

[11] Patent Number: 5,783,339
[45] Date of Patent: Jul. 21, 1998

[54] METHOD FOR PREPARING A COLOR FILTER

[75] Inventors: Tsutomu Watanabe, Itami; Jun-ichi Yasukawa, Chigasaki; Toshiaki Ota, Narashino; Tuyoshi Tokuda, Yachiyo, all of Japan

[73] Assignee: Sumitomo Chemical Company, Limited, Osaka, Japan

[21] Appl. No.: 762,679

[22] Filed: Dec. 11, 1996

Related U.S. Application Data

[63] Continuation-in-part of Ser. No. 530,908, Sep. 20, 1995, abandoned.

[30] Foreign Application Priority Data

Oct. 13, 1994 [JP] Japan ............................ 6-275620

[51] Int. Cl.$^6$ ................................................ G02B 5/20
[52] U.S. Cl. ........................................ 430/7; 430/321
[58] Field of Search ........................ 430/7, 321; 349/106, 349/110

[56] References Cited

U.S. PATENT DOCUMENTS 4,812,387  3/1989  Suzuki et al. ............................ 430/311
5,531,881  7/1996  Matsumura et al. ..................... 204/507

FOREIGN PATENT DOCUMENTS 6-109919  4/1994  Japan.

*Primary Examiner*—John A. McPherson
*Attorney, Agent, or Firm*—Stevens, Davis, Miller & Mosher, L.L.P.

[57] ABSTRACT

Color layers of a color filter obtained by exposing a transparent substrate to light from the back side followed by development may have a defect of layer unflatness produced due to unevenness caused by contamination with foreign matters. The defect can be repaired by eliminating the defective part of the color layers to produce a blank there, optionally filling the blank with a negative photosensitive composition containing a black colorant and returning the thus modified color filter to an appropriate step in the production line. The color filter repaired is used to fablicate multi-color display devices which are by no means inferior in display qualities to those fablicated using a color filter having no defect originally.

8 Claims, No Drawings

METHOD FOR PREPARING A COLOR FILTER

CROSS-REFERENCE TO RELATED APPLICATIONS

This is a continuation-in-part of application Ser. No. 08/530,908, filed on Sep. 20, 1995, now abandoned.

The present invention relates to a method for repairing a defective color filter, a color filter repaired and a multi-color display device provided with the same.

More specifically, the present invention relates to a method for repairing a color filter having a plurality of color layers, at least one of the color layers having a defect of layer unflatness, which is produced due to unevenness caused by contamination of the color layer with foreign matters, and also relates to a color filter repaired and a multi-colored display device provided with the same.

A color filter suitable for use in multi-color display devices such as color liquid crystal displays (LCD) has been manufactured by a dyeing method, a pigment dispersion method, an electrodeposition method, a printing method or the like, according to which the color layers including multi-colored pixels such as red-, green- and blue-colored pixels and black matrices interlaced between the pixels are formed on the surface of glass or other transparent substrates.

In any method mentioned above, it is difficult to avoid contamination of the color layers with dust, waftings in the air and the like during the color layer formation process. Moreover, pigments used as a colorant for the formation of color layers may aggregate under a certain condition and the resulting aggregates contaminate color layers to produce unevenness thereof.

An effort to avoid contamination of the color layers with foreign matters such as dust, waftings in the air, pigment aggregates and the like has been continued, but an industrially economical method to solve the problem has not yet been found.

However, disposal of such defective color filter is not economical from an industrial point of view. Therefore, it has been strongly desired to find an effective method for correcting the defect of layer unflatness caused by contamination of the color layers with foreign matters.

JP-A-4-369604 proposes a method for repairing such defective color filter, which comprises forming a protective film of a material having both flexibility and stripping property on colored pixels including a defective pixel, applying a laser beam to eliminate the defective part of the pixel together with the protective film formed on the defective part, filling the resulting blank with a thermosetting or photo-curable light-screening material of the same color as that of the defective pixel, successively stripping the remaining protective film mechanically, while leaving the light-screening material filled in the blank, and thereafter applying heat or UV ray to cure the light-screening material.

The method is too complex, because it necessitates at least steps of formation and stripping of the specific protective film. Therefore, further improvement has been desired.

Thus, an object of the present invention is to provide an industrially advantageous method for repairing a color filter having a plurality of color layers formed by an electrodeposition method and black matrices formed by a back-face exposure method, at least one of them having the said defect of layer unflatness.

Another object of the present invention is to provide a color filter having a plurality of color layers, at least one of them having the said defect which has been corrected, so that the color filter repaired can be used to fablicate multi-color display devices which are by no means inferior in the display qualities to those fablicated using a color filter having no defect originally.

Further object of the present invention is to provide a multi-color display device provided with the color filter repaired.

These and other objects can be attained by providing a method for preparing a color filter which comprises the steps of:

(a) preparing a transparent substrate having a front surface which carries transparent electroconductive layers and color layers on the transparent electroconductive layers, the front surface being covered with a layer of a negative photosensitive composition containing a black colorant, (b) exposing the transparent substrate to light emitted from a side opposite to the front surface of the transparent substrate followed by development to eliminate the negative photosensitive composition unexposed to light, to obtain a color filter, (c) checking the color filter whether it has a defective part on the color layer such that adversely affects the display qualities, and when it has, transferring it to the following steps (d) and (e), (d) eliminating the defective part on the color layer to produce a blank having a diameter of not more than 250 μm there, to obtain a modified color filter, and (e) (i) returning the modified color filter to step (a), or alternatively, (ii) filling the blank of the modified color filter with a negative photosensitive composition containing a black colorant to obtain a second modified color filter and returning the second modified color filter to step (b).

The objects can be attained also by providing a color filter having a plurality of color layers, at least one of them having the said defect which has been corrected by the said method, and a multi-color display device provided with the color filter repaired.

The present invention is explained in detail as follows.

In the present invention, the formation of color layers on a transparent substrate to obtain a color filter can be carried out by an electrodeposition method which is well known in this art.

According to the electrodeposition method, it is known that the color layers are formed with high precision on electroconductive layers formed in advance on the surface of a transparent substrate.

It is also known that the method is simple in process, high in yield and low in manufacturing cost.

In the present invention, therefore, a color filter is firstly prepared by preparing a transparent substrate having a front surface which carries transparent electroconductive layers and color layers on the transparent electroconductive layers, the front surface being covered with a layer of a negative photosensitive composition containing a black colorant (step (a)); and exposing the transparent substrate to light emitted from a side opposite to the front surface of the transparent substrate followed by development to eliminate the negative photosensitive composition unexposed to light, to obtain a color filter (step (b)).

The negative photosensitive composition may be any one so far as a light-exposed portion of the composition can be easily cured, while a light-unexposed portion thereof can be dissolved and eliminated by development.

The composition can be prepared using at least one photosensitive material such as acrylic, urethane or epoxy resin, synthetic rubber, polyvinyl alcohol, rubber, gelatin and the like, photo-polymerization initiators such as benzophenone, anthraquinone and the like, reactive diluents and photo-sensitizers. Alternatively, commercially available negative photoresist compositions such as OMR-83 (manufactured by Tokyo Ohka Co. Ltd.), commercially available photo-curable paints and inks can be also used.

The black colorant is prepared by mixing pigments. Preferred examples of the pigment are black pigments such as carbon black, aniline black, black titanium oxide and black iron oxide. These pigments can be used each alone or a mixture of two or more.

Further, in accordance with functions to be demanded, additives may be added to the negative photosensitive composition. For example, when the product is used for the purpose of screening light, an appropriate pigment or light-screening agent may be added. When a function of adhesion is required, an appropriate adhesion-improving material may be added. In coating the negative photosensitive composition, the composition may be diluted to an appropriate viscosity or an appropriate solid content in order to improve the workability, by the use of an appropriate organic solvent in the case of organic solvent-dilution type compositions or by the use of water in the case of water-dilution type compositions.

In step (a), it is preferable to use the same negative photosensitive composition containing a black colorant as that used in step (d) explained later.

The electrodeposition method can be carried out, in general, by putting both a substrate having an electroconductive layer on the surface thereof as one electrode and another electrode as a counter electrode into an electrodeposition bath, applying a voltage thereto to form color layers on the electroconductive layer and then heating the color layers formed.

More concretely, the method is mentioned in, for example, JP-A-61-272720, U.S. Pat. No. 4,812,387 or JP-A-62-247331, and JP-A-6-130379.

The method mentioned in JP-A-6-130379 comprises forming a positive photoresist layer on a transparent substrate having an electroconductive layer thereon, eliminating the photoresist layer discretely to bare the surface of the electroconductive layer in a window like form, subjecting the substrate to electrodeposition in order to obtain discrete colored pixels, eliminating the remaining window-frame like photoresist layer and then forming black matrices in the resulting window-frame like blank according to a so-called back-face exposure method, wherein a photo-curable material containing a black pigment is coated on the whole surface of the substrate including the discrete colored pixels, and the photo-curable material coated is exposed to light emitted from the side opposite to the colored pixels-carrying surface of the substrate, followed by development to eliminate the unexposed portion of the photo-curable material.

In the present invention, the color layers can be formed also by a modification of this method, wherein the positive photoresist layer is eliminated first in a window-frame like form, followed by the formation of black matrices therein, and then the remaining window like form photoresist layer is eliminated, followed by the formation of colored pixels therein.

The color layers formed by the afore-mentioned methods are those functioning as a photo-mask in the light-exposure step of the present invention.

The layer of negative photosensitive composition is exposed to light through the color layers, which function as a photo-mask, followed by development in order to eliminate the negative photosensitive composition unexposed to light.

In carrying out the exposure to light, lights having various wavelength can be applied depending on the kind of the negative photosensitive composition. In general, however, lights of UV region are preferred. A preferable light source usable therefor includes a super-high pressure mercury lump, a metal halide lump and the like.

Although the conditions of the exposure to light vary depending on the light source and the kind of the negative photosensitive composition, a preferable light exposure ranges from 100 to 4000 mJ/cm$^2$.

The development can be carried out in order to eliminate the negative photosensitive composition unexposed to light using a suitable developing agent. The agent includes, for example, aqueous solution of sodium hydroxide, sodium carbonate, quarternary ammonium salts or organic amines, and organic solvents such as esters, ketones, alcohols, chlorinated hydrocarbones and the like.

The development can be performed by dipping or showering the substrate into or with the developing agent for about 10 seconds to 5 minutes. Desirably, the substrate is, thereafter, washed thoroughly with water or organic solvents. Subsequently, the washed substrate may optionally be heat-treated at 10°–280° C. and preferably at 100°–280° C., for a period of 10–120 minutes and preferably for 10–12 minutes.

The color filter prepared by steps (a) and (b) is then checked to see if it has a defective part on the color layer such that adversely affects the display qualities, and when it has such a defective part, it is transferred to steps (d) and (e) explained below (step (c)).

There are various methods for checking the color filter. They include a method comprising checking the color filter with a naked eye while illuminating the color filter with the light from a sodium lamp or fluorescent lamp. They also include a checking method by an automatic checking apparatus using a CCD linear image sensor. The automatic checking apparatuses include those utilizing reflected light, transmitted light and both of the lights. Considering the type, size, number etc. of foreign matters, a person skilled in the art will be able to select an appropriate checking method.

In the present invention, the color filters prepared by steps (a) and (b) are checked by any of the above checking methods to see if they have foreign matters in or on the color layers and, depending upon the size and shape of the foreign matters found, classified into two classes, up to grade and off-grade, in accordance with prescribed criteria. The color filters classified into "up to grade" are transferred to subsequent processing steps such as overcoat formation, etc. The color filters classified into "off-grade" are transferred to step (d) and (e) explained below. Prior to the transfer, it is preferable to mark the portions where the foreign matters are present or input the coordinates of the portions in the memory of a computer.

In step (d) of the present invention, a defective part of the color layers is eliminated. The phrase "a defective part of the color layers" is to mean one or more parts of color layers at which unevenness caused by contamination of the color layers with foreign matters is found. The unevenness is easily caused particularly during the afore-mentioned color layer formation process.

Although the elimination can be carried out in any known manner, it can be industrially advantageously carried out by applying a laser beam to the defective part. A wavelength of the laser beam is preferably about 1 µm or less, more preferably about 0.6 µm or less.

The elimination is conducted until the color layer at the defective part is completely removed to produce a blank there.

Favorably, the defective part only is eliminated, but it is allowable to extend the elimination somewhat to circumference of the defective part. The diameter of the blank produced by the elimination of the defective part is preferably not more than about 250 μm. The diameter is defined and estimated by evaluating the display qualities of the multi-color display devices.

Then, the resulting color filter is returned to step (a), or alternatively, the blank of the resulting color filter produced by the elimination of the defective part is filled using as a correcting material a negative photosensitive composition containing a black colorant.

The negative photosensitive composition can be selected from those used in step (a).

Although it is preferred to use a colorant having a similar color to that of the defective color layers, it is not so easy for filling the colorant precisely to each blank of color layer in about 100 μm pitch pixel width.

In the present invention, it has been found that a colorant of a black color to be used for the correcting material has no bad effect upon display qualities of the multi-color display devices regardless of a color of the defective color layers, when the diameter of a blank produced by the elimination of the defective part is not more than about 250 μm, preferably not more than 200 μm. Particularly, it can be said so in case of an about 100 μm pitch color filter having, for example, about 80 μm of pixel width and about 20 μm of black matrix width, provided that the diameter of the blank is calculated by the following equation,

[(long side diameter of the blank)+(short side diameter of the blank)]/2

Accordingly, when the color layers are formed to obtain an about 100 μm pitch color filter by the electrodeposition method as mentioned in, for example, the afore-mentioned U.S. Pat. No. 4,812,397 and JP-A-6-130379, wherein black matrices are formed using a black pigment-containing photo-curable material according to the back-face exposure method, the black pigment-containing photo-curable material used therefor can be used also as the correcting material as it is.

The filling of the blank can be performed by coating an area of the color layers including the blank with the negative photosensitive composition. The coating can be carried out in any known manner such as coating with a writing brush. In this coating process, it causes no trouble to coat the uneliminated color layers besides the blank, because the color layers function as a photo-mask in the following light-exposure step, so that the negative photosensitive composition coated on the uneliminated color layers is left unexposed, and removed by the following development.

A thickness of the coating layer to be formed in the blank can readily be controlled by selecting the content of the negative photosensitive composition and/or a light exposure in the following step.

The thus modified color filter is returned to step (b).

When the negative photosensitive composition used for filling the blank in step (d) shows a similar level of sensitivity to light-exposure and developability as the negative photosensitive composition used for covering the front surface of the substrate in step (a), the modified color filter obtained in step (d) can be returned to step (a) or (b) as it is. The modified color filter is preferably heat-treated at 60°–120° C. for 1–30 minutes prior to returning to steps (a) or (b).

Even when the negative photosensitive composition used in step (d) does not show a similar level of sensitivity to light-exposure and developability as the negative photosensitive composition used in step (a), it is still possible to stock the modified color filters for a certain period of time and thereafter introduce them into either step (a) or (b) while appropriately changing the light-exposure conditions (e.g., light intensity, light-exposure time and temperature) and the developing conditions (e.g., components and its concentration in the developing agent, temperature and time in the course of development).

According to the method of the present invention, a color filter having a plurality of color layers, at least one of the color layers having a defect of layer unflatness, which is produced due to unevenness caused by contamination of the color layer with foreign matters particularly in a process of forming the color layers, can be repaired in a simple and industrially advantageous manner. The foreign matters are originated from the environment (e.g., dusts in the air), equipments (e.g., metal or resin fragments), human causes (e.g., skin, clothes), materials (glass or filler fragments, coating or filler agglomerates), etc. An object of the present invention is to remove such foreign matters from the color filter so that the liquid crystal display using the color filter is up to grade, i.e., without any visible black-defects in the pixels. According to the present invention, there is provided an effective means for repairing the defective parts of the color filter caused by metal and/or glass fragments which cannot be removed by the other means (e.g., abrasion). The color filter repaired can be used to fablicate multi-color display devices such as color liquid crystal displays (LCD) in a conventional manner. The devices fablicated are by no means inferior in the display qualities to those fablicated using a color filter having no defects originally.

The present invention is illustrated in more detail with reference to the following Example, which is only a preferred embodiment of the present invention.

EXAMPLE 1

In a manner similar to that of Example 1 of the afore-mentioned U.S. Pat. No. 4,812,387, was obtained a 100 μm pitch color filter having, in a stripe form, red, green and blue-colored pixels of each 80 μm width, between which black colored layers (black materials) of 20 μm width were formed.

A laser beam of 0.53 μm wavelength was irradiated to three parts of the color layers to make three blanks, where the surfaces of the glass substrate and/or ITO circuit appeared in about 200, 150 and 100 μm diameters, respectively, the diameters being calculated by the afore-mentioned equation.

The same aniline black-containing, negative type photosensitive composition as used above for the formation of black matrices was coated on areas including the three blanks at a length of 1 mm diameter, respectively, using a writing brush, whereby the three blanks were thoroughly filled therewith.

Thereafter, Example 1 of the said Patent was repeated for the exposure to light and the successive development, thereby obtaining the color filter repaired.

The color LCD fablicated in a conventional manner using the resulting color filter showed display qualities similar to that fablicated using a color filter having no defect originally.

EXAMPLE 2

(1) Formation of stripe-form, transparent, electrically conductive circuit pattern on transparent substrate On a glass substrate having a thickness of 1.1 mm, stripe-form ITO circuits (sheet resistance: 15 Ω/□) each having a width of 80 μm were formed in parallel and linearly at intervals of 20 μm (100 μm pitch).

(2) Formation of color layers (red, green and blue) on electrically conductive circuit pattern Using transparent conductive circuits on the transparent substrate as one electrode, electro-deposition was carried out in order of red, green and blue coatings. As the electro-deposition coating materials, aqueous solutions of an anionic polyester resin containing a red pigment (azo metallic salt type red pigment), a green pigment (Phthalocyanine Green) and a blue pigment (Phthalocyanine Blue), respectively, in the state of dispersion [trade name Shintron F-Red-C (red), trade name Shintron F-Green-C (green) and trade name Shintron F-Blue-C (blue), all manufactured by Shinto Paint Co.] were used. The electro-deposition was carried out at 50–80 V for a period of 10–20 seconds, which conditions were varied depending on the color. Then, the resulting electro-deposited films were thoroughly washed with water and heat-treated at 260° C. for one hour.

As a result, red-, green- and blue-colored films each having a thickness of 1.2 μm were formed. These films had properties of screening UV light.

(3) Coating a black photoresist

A coating material for black matrix (negative photoresist, manufactured by Shinto Paint Co.) was coated by the screen printing method on the whole surface of the substrate obtained in (2). After the coating, the coating film was heat-treated at 100° C. for 10 minutes. The film thus formed had a thickness of about 8 μm.

(4) Exposure of negative photoresist film to light The substrate obtained in (3) was exposed to UV light from the opposite side of the conductive circuits-carrying surface at a distance of 10 cm for a period of 10 seconds. The light exposure was 1,800 mJ/cm². The main wavelengths of the UV light used herein were 313 nm and 365 nm.

(5) Development and washing

The substrate obtained in (4) was then immersed in ethyl cellosolve acetate for 2 minutes, while applying ultrasonic wave thereto, whereby the coating film of the unexposed parts [the parts obstructed from exposure due to the existence of light-screening film formed in (2)] was eliminated. Then, the resulting product was immersed in an ethyl cellosolve acetate washing liquor for 30 seconds, and thereafter immersed in isopropyl alcohol and deionized water successively each for a period of 30 seconds. Then, the resulting product was heated and the remaining films were cured at 230° C. for 30 minutes.

As a result, a black film (1.2 μm thick) was formed.

(6) A prescribed number of substrates were prepared by the above steps (1)–(5). The thus prepared substrates were checked with an automatic checking apparatus LCF-5013 (mfd. by Admon Science Co.) to see if they had one or more defective parts having a size between 40 μm inclusive and 250 μm inclusive. The substrates having one or more defective parts were subjected to elimination of the defective parts with a laser beam having a wavelength of 520 nm using a laser beam machine LRC-5001ML (mfd. by Admon Science Co.).

(7) The substrates of which the defective parts had been eliminated in (6) were subjected to the operations of steps (3), (4) and (5) again in this order to obtain defective part-repaired substrates.

(8) The defective part-repaired substrates (color filters) were coated with a coating agent to form a top coat protective layer, and then patterning of electrodes for driving was provided thereon to obtain multi-color display devices. The color liquid crystal display equipped with one of the multi-color display devices had no black-defects in the pixels.

What is claimed is:

1. A method for preparing a color filter which comprises the steps of:

(a) preparing a transparent substrate having a front surface which carries transparent electroconductive layers and color layers on the transparent electroconductive layers, the front surface being covered with a layer of a negative photosensitive composition containing a black colorant, (b) exposing the transparent substrate to light emitted from a side opposite to the front surface of the transparent substrate followed by development to eliminate the negative photosensitive composition unexposed to light, to obtain a color filter, (c) checking the color filter to determine whether it has a defective part on the color layer such that adversely affects the display qualities, transferring said color filter having said defective part to the following steps (d) and (e), (d) eliminating the defective part of the color layer to produce a blank having a diameter of not more than 250 μm there, to obtain a modified color filter, and (e) (i) returning the modified color filter to step (a).

2. The method according to claim 1, wherein the transparent substrate is a glass substrate and the color layers are red-, green-, blue- and black-color layers.

3. The method according to claim 1, wherein the elimination of the defective part is carried out using a laser beam.

4. The method according to claim 3, wherein the laser beam has a wavelength of 1 μm or less.

5. A method for preparing a color filter which comprises the steps of:

(a) preparing a transparent substrate having a front surface which carries transparent electroconductive layers and color layers on the transparent electroconductive layers, the front surface being covered with a layer of a negative photosensitive composition containing a black colorant, (b) exposing the transparent substrate to light emitted from a light emitting means positioned on a side opposite to the front surface of the transparent substrate followed by development to eliminate the negative photosensitive composition unexposed to light, to obtain a color filter, (c) checking the color filter to determine whether it has a defective part on the color layer such that adversely affects the display qualities, transferring said color filter having said defective part to the following steps (d) and (e), (d) eliminating the defective part of the color layer to produce a blank having a diameter of not more than 250 μm there, to obtain a modified color filter, and (e) filling the blank of the modified color filter with a negative photosensitive composition containing a black colorant to obtain a second modified color filter and exposing the second modified color filter to light emitted from the light emitting means of step (b).

6. The method according to claim 5, wherein the transparent substrate is a glass substrate and the color layers are red-, green-, blue- and black-color layers.

7. The method according to claim 5, wherein the elimination of the defective part is carried out using a laser beam.

8. The method according to claim 7, wherein the laser beam has a wavelength of 1 μm or less.

* * * * *